United States Patent [19]

Gabrielian

[11] 4,029,375

[45] June 14, 1977

[54] MINIATURE ELECTRICAL CONNECTOR

[75] Inventor: Henry Gabrielian, Newport Beach, Calif.

[73] Assignee: Electronic Engineering Company of California, Santa Ana, Calif.

[22] Filed: June 14, 1976

[21] Appl. No.: 696,109

[52] U.S. Cl. .......................... 339/17 M; 339/254 M

[51] Int. Cl.[2] .......................................... H05K 1/12

[58] Field of Search ............. 339/17 R, 17 C, 17 F, 339/17 L, 17 LM, 17 M, 45, 46, 75 MP, 252 R, 254 R, 254 M

[56] References Cited

UNITED STATES PATENTS

| | | | |
|---|---|---|---|
| 1,504,463 | 8/1924 | Douglas | 339/254 M |
| 2,929,042 | 3/1960 | Guttridge | 339/18 C |
| 3,290,636 | 12/1966 | Overtveld | 339/254 M |
| 3,887,257 | 6/1975 | Panek et al. | 339/46 |
| 3,982,159 | 9/1976 | Dennis et al. | 339/17 CF |

*Primary Examiner*—Roy Lake
*Assistant Examiner*—Neil Abrams
*Attorney, Agent, or Firm*—Harry R. Lubcke

[57] ABSTRACT

A flat electrical connector employing axially compressed helical springs for contacts. The springs float in a housing between two flanking insulative members having printed circuit contact areas to mate with each end of each spring. The connecting force required to press one insulative member against one end of each spring is minimal, and the disconnecting force is negative. The springs may power enclosing telescoping contacts that function in the same manner as the springs alone.

11 Claims, 4 Drawing Figures

MINIATURE ELECTRICAL CONNECTOR

BACKGROUND OF THE INVENTION

This invention pertains to electrical connectors having resilient compression contacts.

The classical electrical connector has employed a male and female contact pair for each circuit conductor that is to be connected.

A disadvantage of this type of connector is the magnitude of the connecting and disconnecting force required when the connector includes a number of contact pairs. Maintenance groups in certain industries, such as the aircraft industry, find this a serious disadvantage, and one which often results in the connector becoming faulty in both contact resistance and the integrity of the over-all connector structure as well.

In a related art having to do with establishing connections to printed circuit boards in electronic apparatus, a coiled spring is used to urge a contact ball above the surface of an insulating board so that the ball contacts a printed circuit on another board that is essentially coplanar with the insulating board. The spring does not float between the contacts sought to be made.

Also in that art, contacts are made to spaced but parallel-planar printed circuit boards by the sides of coiled springs. The springs are encapsulated in an at least partially resilient plastic, save for approximately a quarter circumference on opposite sides of the spring. Although otherwise embedded in the plastic these segments of each convolution of the spring remain free. When two printed circuit boards are pressed against the opposite sides of the spring, contact is made from one board to the other through the convolutions of the spring.

The ends of the spring are not used for contacting.

In the electrical computer art, simple cantilever springs project from an insulative board and pass through the known punched apertures in a punched card at the locations where the apertures are aligned with the springs. Electrical contact is then made with a conductive plate that is coplanar with the opposite side of the punched card.

Elsewhere in that art, a similar folded-over cantilever contact having an external soldering tang is held to bear upon the conductors of a printed circuit; thereby to provide external contacts for the same.

SUMMARY OF THE INVENTION

This electrical connector is typically multi-contact, with each contact accomplished by compressing a spring between opposed contact surfaces, rather than by engaging two conductors in a force fit.

Normally, the contacts are distributed over the area of a planar housing of insulating material, in which the contacts are axially contained when the connector is disconnected by a shoulder within an aperture that individually holds each resilient contact.

Printed circuit or equivalent electrical conductors are present at each end of a spring when the connector is connected. The structure is proportioned so that the spring axially floats between the conductors at each end thereof; thus importantly effectively insuring firm contacting throughout the life of the connector. The life has been determined as perhaps a thousand times longer than the prior "mil. spec." connector specification.

The connection force is nominal, consisting of the force required to slightly compress the several springs. No force is required to disconnect the connector. When a latch joining the two parts of the connector is unfastened, the several springs return to the uncompressed state and push the two parts of the connector apart.

Because of the favorable stress situation in the connection - disconnection cycle of this connector the number of contacts can be increased over the number feasible in prior art connectors; increased, say, to two hundred contacts.

The typical over-all shape is flat, and because of this the connector is relatively miniature and compatible with circuit structures of the present day.

DESCRIPTION OF THE PREFERRED EMBODIMENTS

Figure 1:
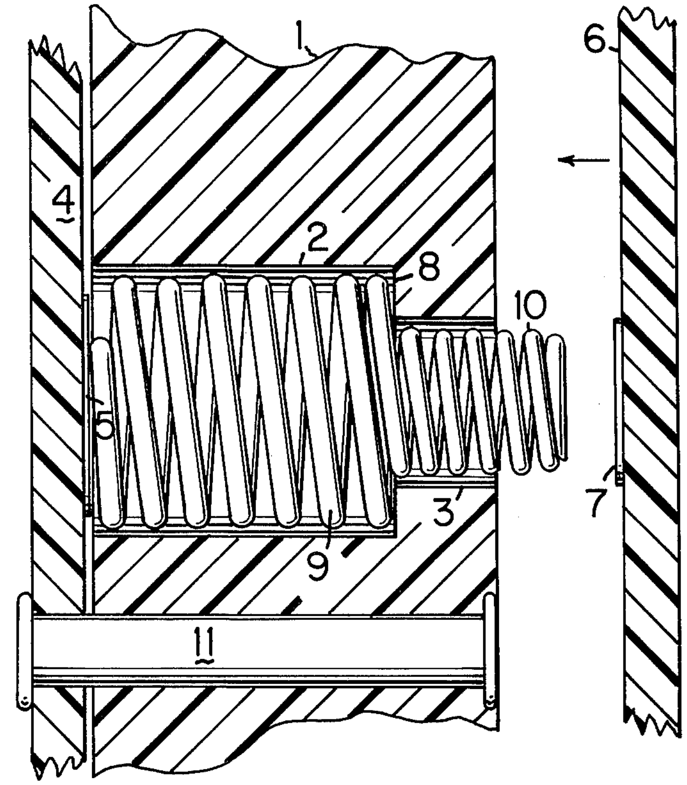
FIG. 1 is a sectional view, enlarged, of a single resilient contact with the companion portions of the insulative housing and the two end contact members, in the disconnected position.
Figure 2:
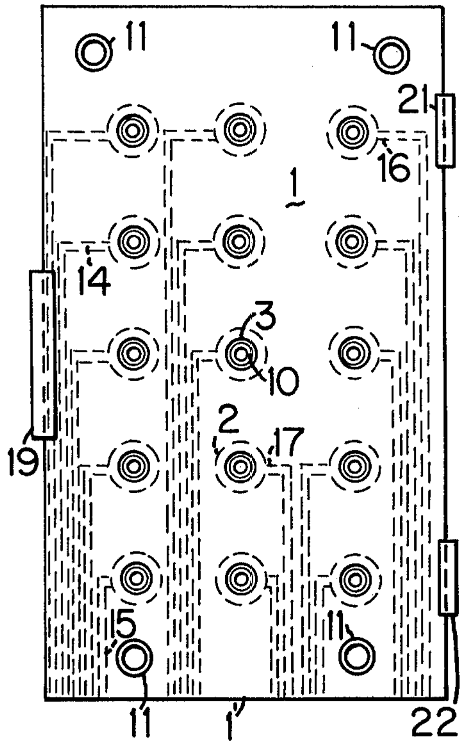
FIG. 2 is a top plan view of an illustrative multi-contact connector, showing the housing and the resilient contacts.

In FIG. 1, numeral 1 indicates the insulative housing of the connector. This may have a considerable planar extent in order to accommodate the plurality of contacts usually desired in a connector of this type, as shown in FIG. 2. Each contact is housed in an aperture 2, having a shoulder 8 and a smaller portion 3 of smaller transverse extent than the main part of the aperture.

The apertures are distributed over the area of the housing, as shown in FIG. 2. The minimum preferred separation between each aperture is equal to the maximum transverse extent of the aperture.

In order that a significant objective of this invention shall be attained, insulative housing 1 acts principally as a positioner for the normally plural resilient elements 9, 10, and a retainer when the second insulative member 6 is removed from the assembly. This is shown in FIG. 1, where the last convolution of the 9 portion of the spring is butted against shoulder 8.

Figure 3:
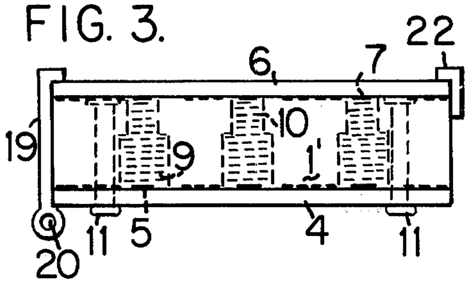
FIG. 3 is an end elevation view of the same.

It will be recognized from first principles that when second insulative member 6 is in contact with housing 1, and thus the connector is connected as shown in FIG. 3, the protruding portion 10 of the spring shown in FIG. 1 is forced into housing 1. Since this whole resilient element is resilient the new configuration will be distributed throughout the element. This is sufficient to remove the last convolution 9 from the shoulder 8.

The force of the compressed resilient member 9, 10 is then exerted only against conductive areas 5 and 7.

This is a great advantage, since these are the areas where electrical contact is made to give the desired electrical connection. Not only will the maximum contact pressure available be exerted, but each resilient member contact is free to occupy this essential position, regardless of minor inaccuracies in the structure.

The transverse extent, or diameter, of resilient means, or spring, 9, 10, is slightly less than the corresponding extent of aperture 2, 3, so that free axial movement of the spring is possible at all times.

While various proportions are possible, the axial length of the lesser axial portion 3 of an aperture is preferably approximately one-third of the greater axial portion 2.

The ratio between the portions 10 and 9 of the spring are also approximately the same.

A first insulative member 4 is typically coextensive with housing 1 and is assembled thereto in a parallel planar configuration. This member may be a printed circuit board or an equivalent, suited to support electrically conductive areas 5. These areas are disposed as may be desired for the particular application. A disposition that is suited for a flat connector, which is a distinguishing characteristic of the device of this invention, for connection to a flat cable that is to terminate in the connector, is shown in FIG. 2.

Fifteen resilient element contacts are shown in FIG. 2, as an example, but this number may be anything from unity to a few hundred. Conductive area 5 not only extends beneath spring 9, there being preferably of circular configuration, but it also extends to an end face 1′ of housing 1. Typically, a printed circuit conductive area extends from the location of each of the resilient elements to face 1′, such as 14, 15, 16, 17.

At the face 1′ end of first insulative member 4, the several conductive areas can be soldered or crimped-connector connected to individual conductors of a wired cable, or to the printed circuit conductors of a flat and flexible printed circuit cable.

Of course, the printed circuit configuration upon member 4 may be configured so that some of the conductive areas terminate at the face opposite face 1, or at the sides, or through ilets to the exterior surface of member 4. The term "printed circuit" is intended to include other means of establishing contact from one location to another, which could even include insulated wires.

In a typical embodiment of the connector of this invention first insulative member 4 is rigidly fastened to housing 1. While known fasteners such as a bolt threaded into the housing could be used, it is preferable for permanence to use hollow rivets, such as 11. It is preferable, but not mandatory that the end thereof that passes through the housing be countersunk, as shown, in order that the placement of the second insulative member 6 be close to the surface of the housing when the connector is assembled to accomplish the electrical connection process. Rivet 11 is one form of a permanent compressed-in-place fitment.

In FIG. 1 the establishment of the connection between the two parts of the connector is accomplished by moving parts 1 and 6 together. This compresses spring 9, 10 until portion 10 is flush with the surface of housing 1. This is shown in FIG. 3. The spring then "floats" between conducting areas 5 and 7 as has been stated previously.

In order to maintain the connection between the parts of the connector, a form of latch means is required in a typical embodiment. This is principally a hinged latch 19, having a hinge 20 at the bottom of the structure and a lip at the top to secure the second insulative member 6 to housing 1. Coacting with the hinged latch are two stationary latches 21 and 22. These are affixed to housing 1 and have an upper lip under which member 6 is first slipped and then hinged latch 19 is revolved into place to provide latching constraint at both sides of the housing and the member.

The latching arrangement may be modified by having additional latches of the same type, or longer latches. A detent is preferably arranged so that hinged latch 19 normally remains securely in place.

Resilient means 9, 10 may be fabricated of beryllium-copper to provide stability of mechanical resilience, may be heat-treated for strength, and may be gold plated for anti-corrosion protection. Other similar commercially available alloys having lower electrical resistance may also be used. Phosphor-bronze is an inexpensive substitute, but the electrical and mechanical characteristics are inferior to beryllium-copper.

Insulative housing 1 and the insulative members 4 and 6 may be fabricated of a dimensionally stable plastic, of which the polycarbonate and nylon are examples. The former may be obtained under the trade name Lexan and the latter under Zytel.

The structure recited above is suitable for connecting circuits carrying electric currents found in instruments and of nominal amplitude, such as up to ½ ampere.

Figure 4:
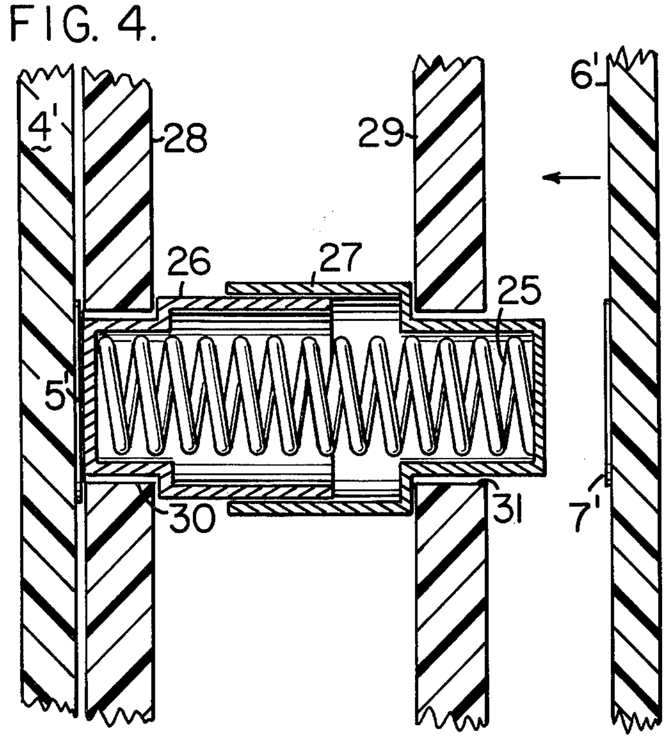
FIG. 4 is a sectional view, enlarged, of a single resilient contact, including a telescoping cups structure in addition to the resilient element.

For higher currents, such as up to five amperes, the modification of FIG. 4 is employed.

The structure is essentially the same and functions in the same manner as before. However, typically, a spring 25 of uniform transverse extent and two cup-like electrically conductive elements 26 and 27 comprise the generic electrically conductive resilient element 9, 10 of the earlier embodiment.

The cup elements are formed of high conductivity copper and carry essentially all of the electric current. They are arranged to telescope, with sufficient clearance to be moved axially by the force of the spring but to make electrical contact, one with the other, for conveying the electric current. The cup elements may be gold plated to prevent corrosion, etc.

In FIG. 4, housing 1 is represented as two insulative pieces 28 and 29. These are fastened together elsewhere to form a unitary housing. Apertures 30 and 31 retain the cup assembly at either end as did the aperture of smaller transverse extent 3 before. Either piece 28 or 29 may extend axially of the cup assembly to fill in the space between these two pieces with an aperture of large transverse extent, as 2, previously. Two parts, as 28 and 29, are required in the embodiment of FIG. 4; however, in order that the whole can be assembled.

The additional two insulative members 4′ and 6′ are essentially as before; thus these have been given primed identification numerals. Similarly identified are contact conductive areas 5′ and 7′. The printed circuit connections may be as previously in FIG. 2, as may be the latch means.

Spring 25 is an example of a spring-like means.

I claim:

1. An electrical connector, comprising;

a. an insulative housing (1) having plural apertures, each said aperture having an axial portion of large transverse extent (2)
   and a lesser axial portion of smaller transverse extent (3), b. an electrically conductive helical wound resilient element (9,10;) within each said aperture,
   each said resilient element having portions of different transverse area extent proportional to the area of portions (2,3) of said apertures in which they are located, resilient over the full axial extent thereof, and of a slightly lesser transverse extent to allow free axial movement of each portion of said resilient element within a said aperture, the greater transverse area extent of each said resilient element exceeding the smaller transverse extent of the aperture containing said resilient element, c. a first insulative member (4), d. means to attach (11) said first insulative member to said housing adjacent to the aperture portions of large transverse extent, e. said first insulative member having electrically conducting areas (5) contacting at least some of said resilient elements, f. a second insulative member (6) removably attachable to said housing, and g. electrically conductive areas (7) upon said second insulative member contacting at least some of said resilient elements, so that attachment of said second insulative member (6) causes each said resilient element to be axially constrained by said first and second insulative members.

2. The connector of claim 1, in which;

a. said apertures (2,3) are cylindrical holes, and b. each said aperture contains a single compressive spring (9,10).

3. The connector of claim 1, in which;

a. said smaller transverse extent of said apertures is approximately sixth-tenths of said large transverse extent.

4. The connector of claim 1, in which;

a. said lesser axial portion of said apertures is approximately one-third of said axial portion.

5. The connector of claim 1, in which;

a. said resilient element is formed with the axial portion of smaller transverse extent (10) having a greater axial length than the axial length of said portion of smaller transverse extent (3) of said aperture.

6. The connector of claim 1, in which;

a. said conductive areas (5) of said first insulative member (4) are printed circuit conductive areas, which are in removable contact with said resilient elements (9).

7. The connector of claim 1, in which;

a. said conductive areas (7) of said second insulative member (6) are printed circuit conductive areas, which are in removable contact with said resilient elements (10) to effect disconnection of said electrical connection.

8. The connector of claim 1, in which;

a. said means to attach (11) said first insulative member to said housing is a permanent compressed-in-place fitment.

9. The connector of claim 1, which additionally includes;

a. both stationary and moveable latch means (19, 21, 22) attached to said housing (1) to removably secure said second insulative member (6) to said housing.

10. An electrical connector, comprising;

a. a housing having plural insulative pieces (28, 29) with plural groups of aligned apertures (30, 31), b. spring-like means (25) having a length in excess of the extent of said housing disposed within each of said aligned apertures, c. a first cup-like electrically conductive element (26) that has plural transverse dimensions and surrounds one end of said spring-like means, d. a second cup-like electrically conductive element (27) that has plural transverse dimensions, surrounds the other end of said spring-like means, and also said first cup-like electrically conductive element;

being in electrical contact therewith, the smaller of said plural transverse dimensions of each said cup-like electrically conductive element nested within a said aligned aperture, e. a first insulative member (4') that has electrically conductive areas (5') contacting at least some of said cup-like electrically conductive elements, and f. a second insulative member (6') removably attachable to said housing that has electrically conductive areas (7') contacting at the opposite ends the said some of the cup-like electrically conductive elements, so that attachment of said second insulative member (6') causes each said spring-like means, said first cup-like and said second cup-like conductive element assembly to be axially constrained only by said first and second insulative members.

11. The connector of claim 10, in which;

a. said spring-like means in a coiled spring of uniform transverse extent, and b. said first and second cup-like means have a smaller transverse extent at opposite ends thereof.

* * * * *